(12) United States Patent
Tripathi et al.

(10) Patent No.: US 10,872,674 B1
(45) Date of Patent: Dec. 22, 2020

(54) REGULATION OF VOLTAGE GENERATION SYSTEMS

(71) Applicant: MICRON TECHNOLOGY, INC., Boise, ID (US)

(72) Inventors: Manan Tripathi, Sunnyvale, CA (US); Michele Piccardi, Cupertino, CA (US); Xiaojiang Guo, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/722,054

(22) Filed: Dec. 20, 2019

(51) Int. Cl.
*G11C 16/30* (2006.01)
*G11C 16/32* (2006.01)
*G11C 16/04* (2006.01)

(52) U.S. Cl.
CPC .......... *G11C 16/30* (2013.01); *G11C 16/0483* (2013.01); *G11C 16/32* (2013.01)

(58) Field of Classification Search
None
See application file for complete search history.

(56) References Cited

U.S. PATENT DOCUMENTS

| 7,554,311 | B2 | 6/2009 | Pan |
| 9,621,032 | B2 | 4/2017 | Pan |
| 9,659,602 | B2 | 5/2017 | Qiao et al. |
| 2006/0133149 | A1* | 6/2006 | Chae ............... G11C 5/145 365/185.18 |
| 2007/0139099 | A1 | 6/2007 | Pan |
| 2007/0139100 | A1 | 6/2007 | Pan |
| 2018/0323704 | A1 | 11/2018 | Pan et al. |

* cited by examiner

*Primary Examiner* — Tan T. Nguyen
(74) *Attorney, Agent, or Firm* — Dicke, Billig & Czaja, PLLC

(57) ABSTRACT

A voltage generation system might include a resistive voltage divider having a first resistance connected between its output and a first feedback node and a second resistance connected between the first feedback node and a first voltage node, a capacitive voltage divider having a first capacitance connected between its output and a second feedback node and a second capacitance connected between the second feedback node and the first voltage node, a comparator having an input connected to the second feedback node, and a voltage generation circuit configured to generate a voltage level at its output responsive to an output of the comparator and to a clock signal, wherein the first feedback node is selectively connected to the second feedback node and selectively connected to a second voltage node, wherein the first resistance is selectively connected to the first feedback node, and wherein the second resistance is selectively connected to the first voltage node.

26 Claims, 10 Drawing Sheets

REGULATION OF VOLTAGE GENERATION SYSTEMS

TECHNICAL FIELD

The present disclosure relates generally to integrated circuits, and, in particular, in one or more embodiments, the present disclosure relates to apparatus and methods for regulation of voltage generation systems in integrated circuits, e.g., memory.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Integrated circuit devices generally are powered by two or more externally-supplied voltages, such as Vcc and Vss. In addition to the supply voltages, integrated circuit devices often generate other voltages utilized in the operation of that device. For example, in a memory, such internally-generated voltages are often utilized during access operations, such as during a sensing operation, a program operation (often referred to as a write operation), or an erase operation. The internally-generated voltages are often higher (e.g., much higher) or lower than any supply voltage.

Generating other voltage levels from a supply voltage is often performed using a charge pump or other voltage generation circuit. Charge pumps often utilize alternating switched capacitances (e.g., capacitors) to generate a higher or lower voltage from a supply voltage. Power efficiency is often an important consideration in the design and usage of integrated circuit devices, and the generation and transmission of these internal voltages often results in significant power losses.

DETAILED DESCRIPTION

Figure 1:
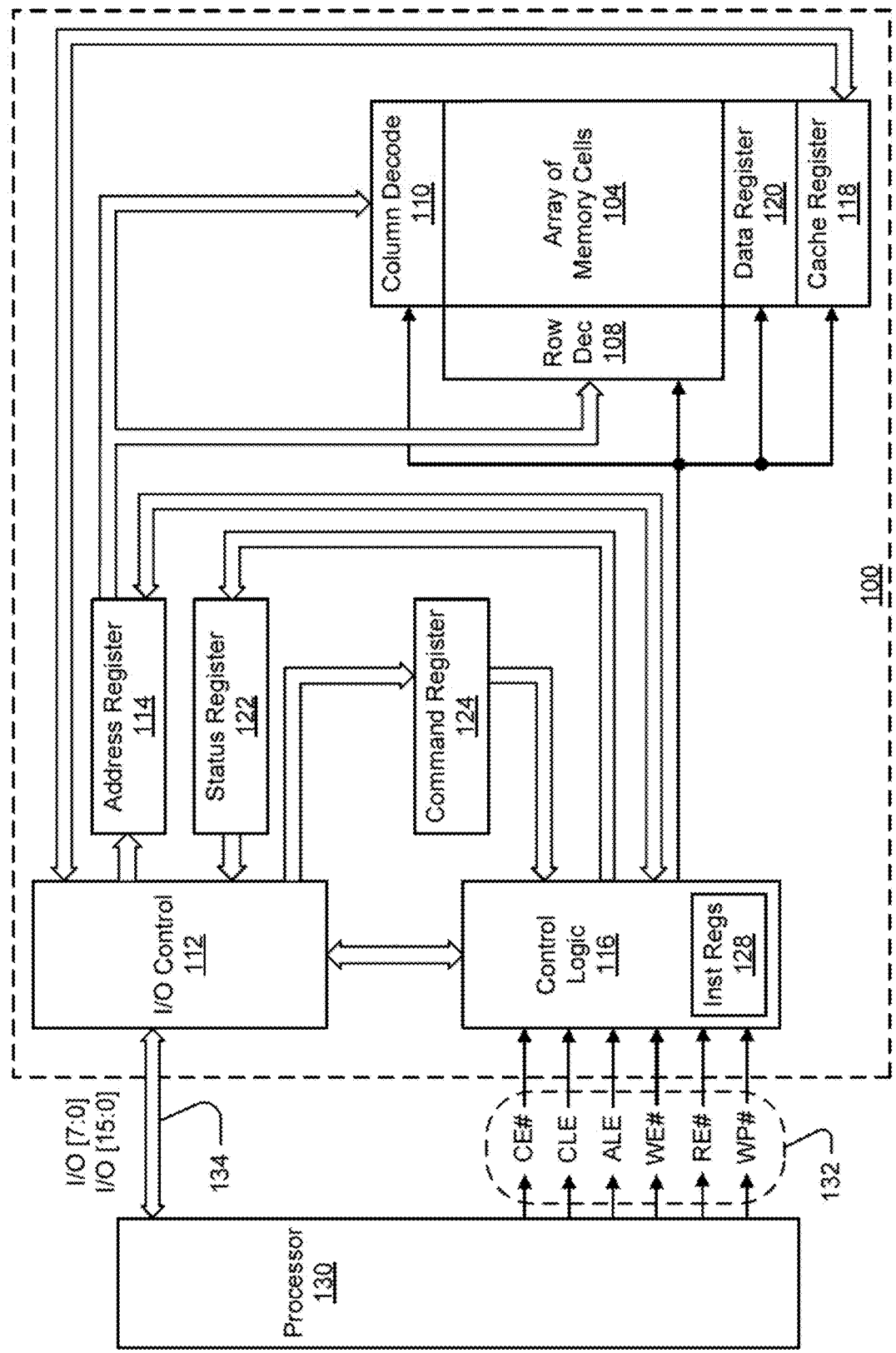
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
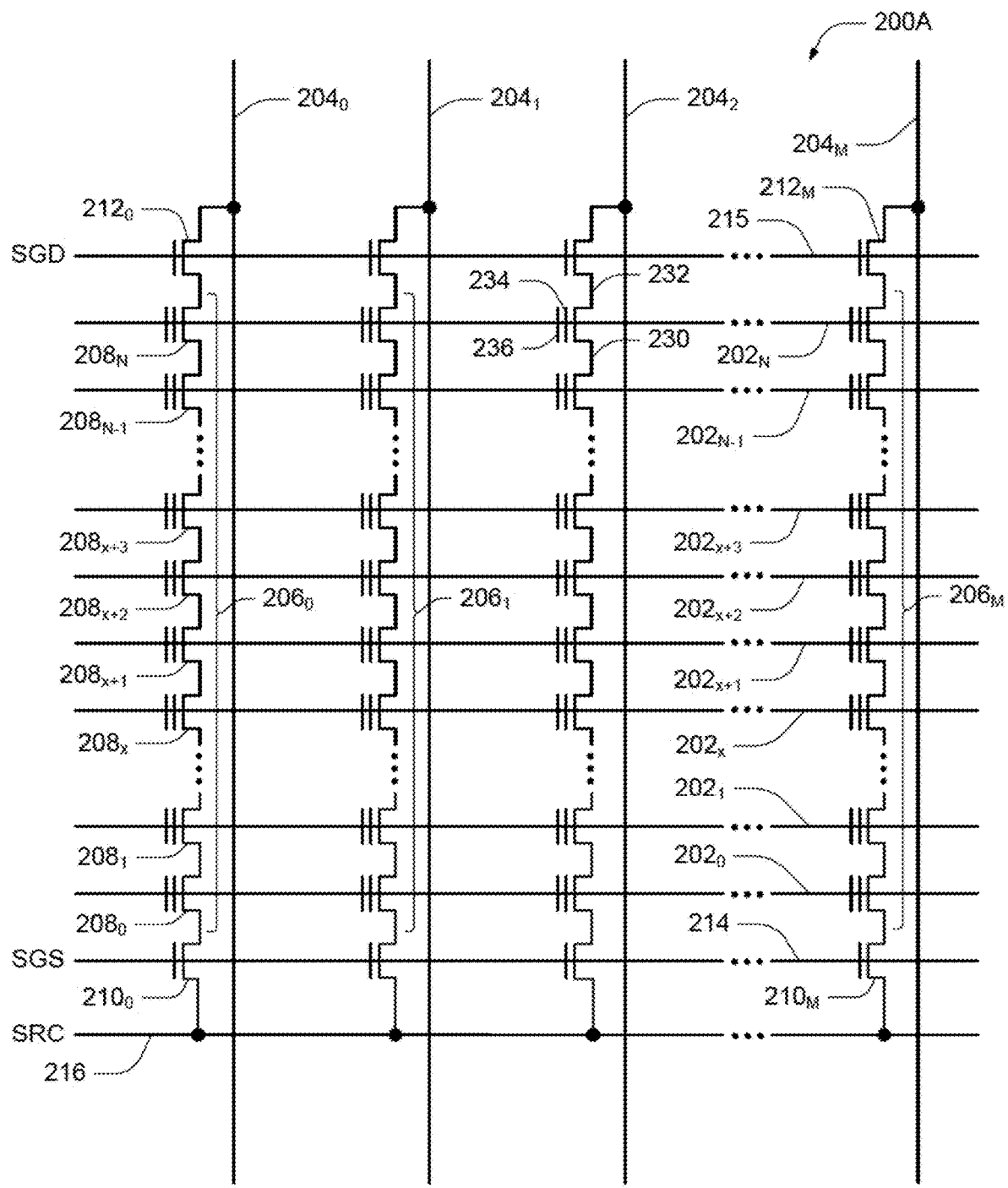
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
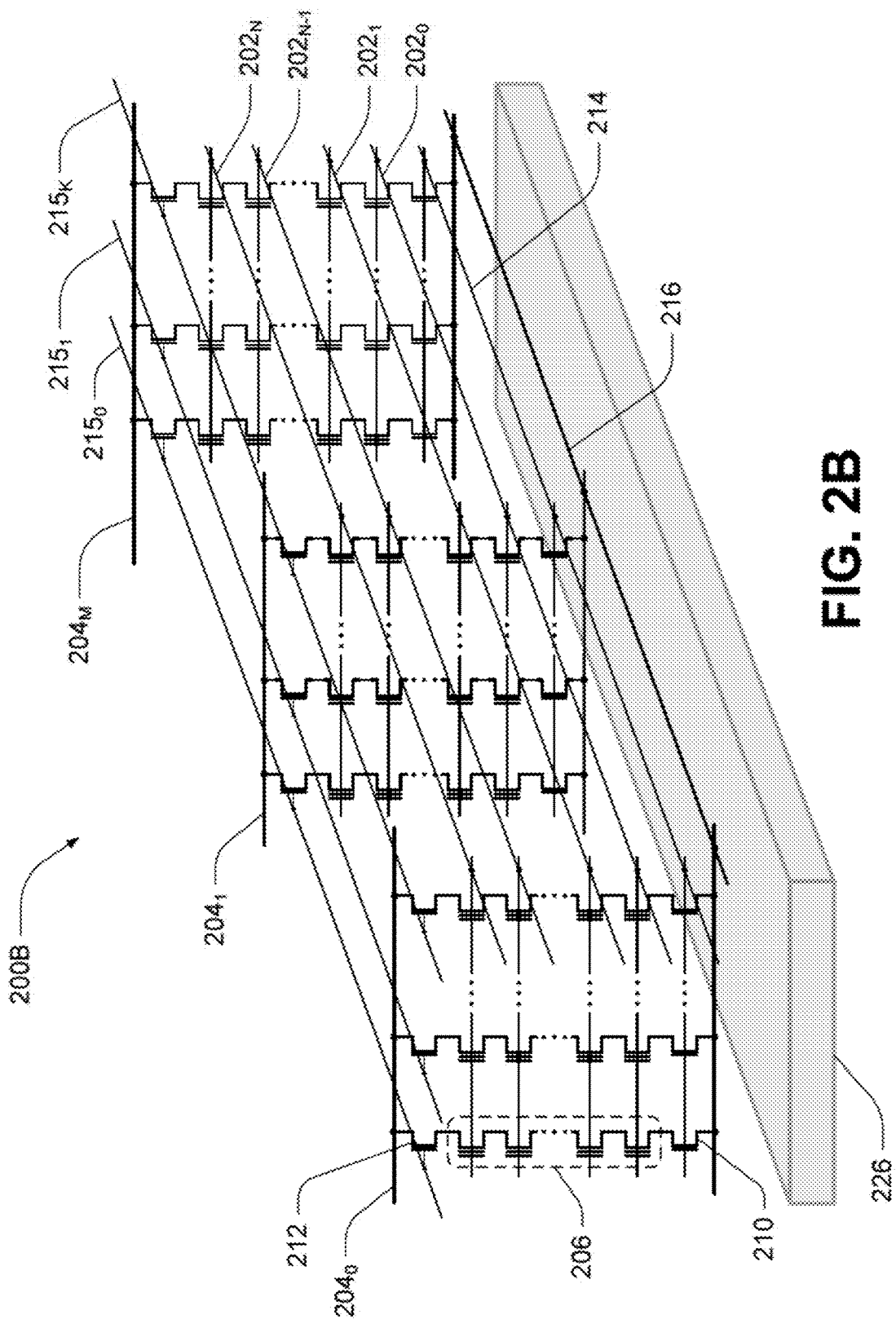

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience. The peripheral circuitry 226 might include voltage generation systems and/or control signal generators of various embodiments.

Voltage generation circuits typically increase or decrease an input supply voltage in order to provide a higher or lower output voltage, respectively, required to operate circuit elements in integrated circuit devices. A charge pump is one type of voltage generation circuit typically employed in integrated circuit devices such a non-volatile memory systems. A charge pump typically includes several stages which may each include a stage capacitance which is charged and discharged during a clock cycle of the charge pump. A voltage isolation device may be coupled between the stage capacitance and the stage input voltage to mitigate loss of the developed output voltage of the stage.

One or more clock signals typically trigger the charging of the stage capacitances. A typical clock signal may have a clock frequency with a period less than the discharge time of the capacitances. In one such design, two clock signals having opposite phase trigger the charging of alternate stages of a multi-stage charge pump.

Figure 3:
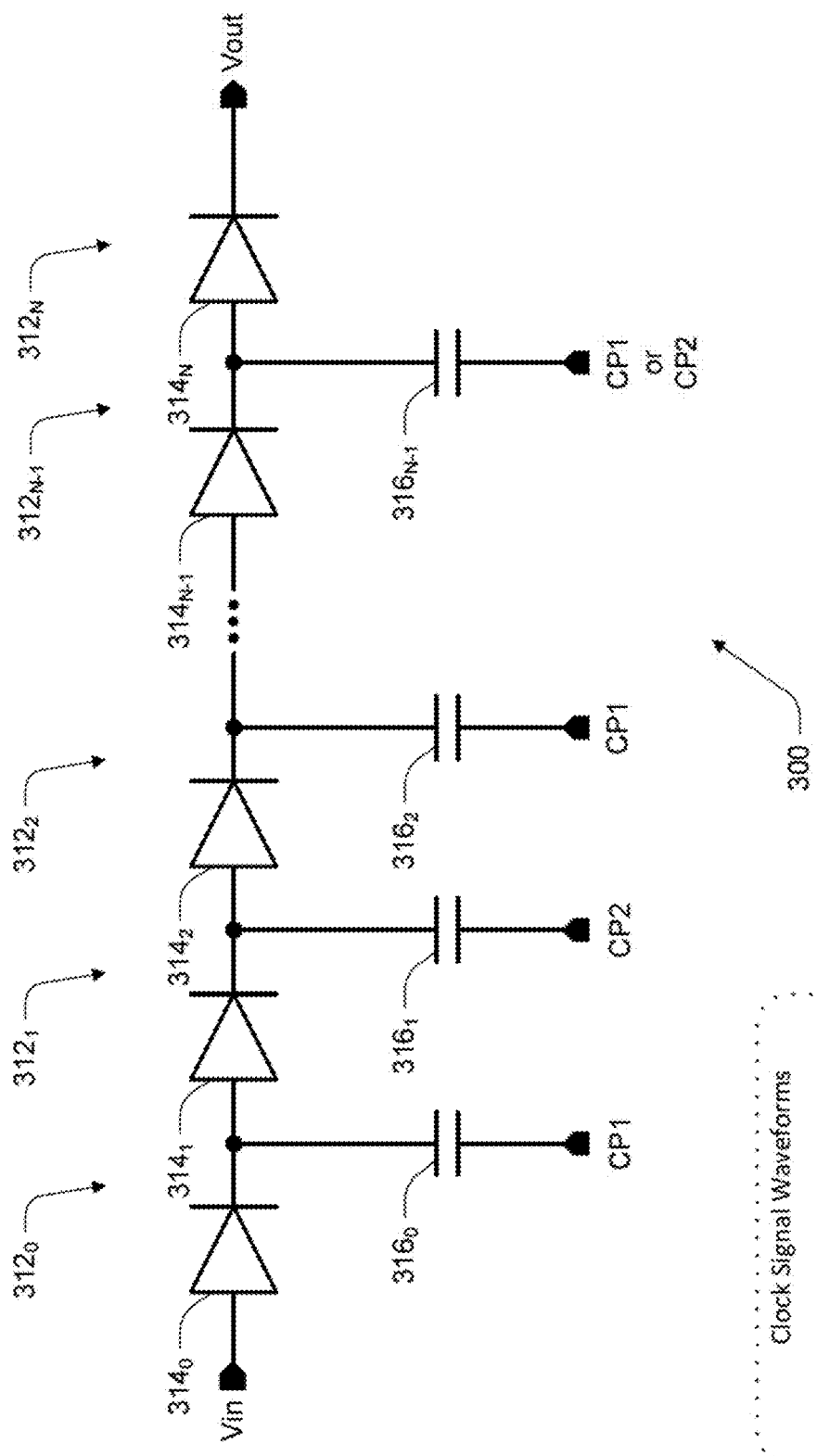
FIG. 3 is a schematic of a conventional charge pump of the related art.

An example of a conventional charge pump 300 of the related art is illustrated schematically in FIG. 3. Charge pump 300 might represent a positive charge pump, e.g., developing an increasing voltage level at its output.

Charge pump 300 receives an input voltage Vin, which might be Vcc for example. A first clock signal CP1 might be received at one input (e.g., electrode) of alternating stage capacitances, e.g., stage capacitances $316_0$, $316_2$, $316_4$, etc., while a second clock signal CP2 might be received at one input (e.g., electrode) of alternating stage capacitances, e.g., stage capacitances $316_1$, $316_3$, $316_5$, etc. While stage capacitances $316_3$, $316_4$ and $316_5$ are not directly shown in FIG. 3, it is apparent from the numbering of stage capacitances 316 from 0 to N. Clock signals CP1 and CP2 might generally have opposite phases, the same frequency, and similar (e.g., the same) amplitudes, which might correspond to the amplitude of a supply voltage.

Charge pump 300 might include N+1 stages 312. The stages $312_0$ through $312_N$ might each include a stage capacitance 316. The stages $312_0$ through $312_N$ might further include a voltage isolation device 314, e.g., a diode. The (N+1)th stage $312_N$ of the charge pump 300 might contain voltage isolation device 314N without a corresponding stage capacitance 316. The voltage isolation device 314N might be included to protect a load, e.g., circuitry configured to receive the output voltage Vout. As an example, the load might be an access line 202 selectively connected to receive Vout. In this example, the access line 202 might be configured to receive a voltage level associated with an access operation, e.g., a sense operation or a programming operation. In the charge pump 300, the voltage isolation devices 314 might generally mitigate charge or discharge of the stage capacitances 316 between cycles of their respective clock signal CP1 or CP2. Thus, the charge pump 300 might progressively store more charge on the capacitance component of each stage, and several such stages being placed together in the charge pump 300 can produce an increasing voltage level.

Figure 4:
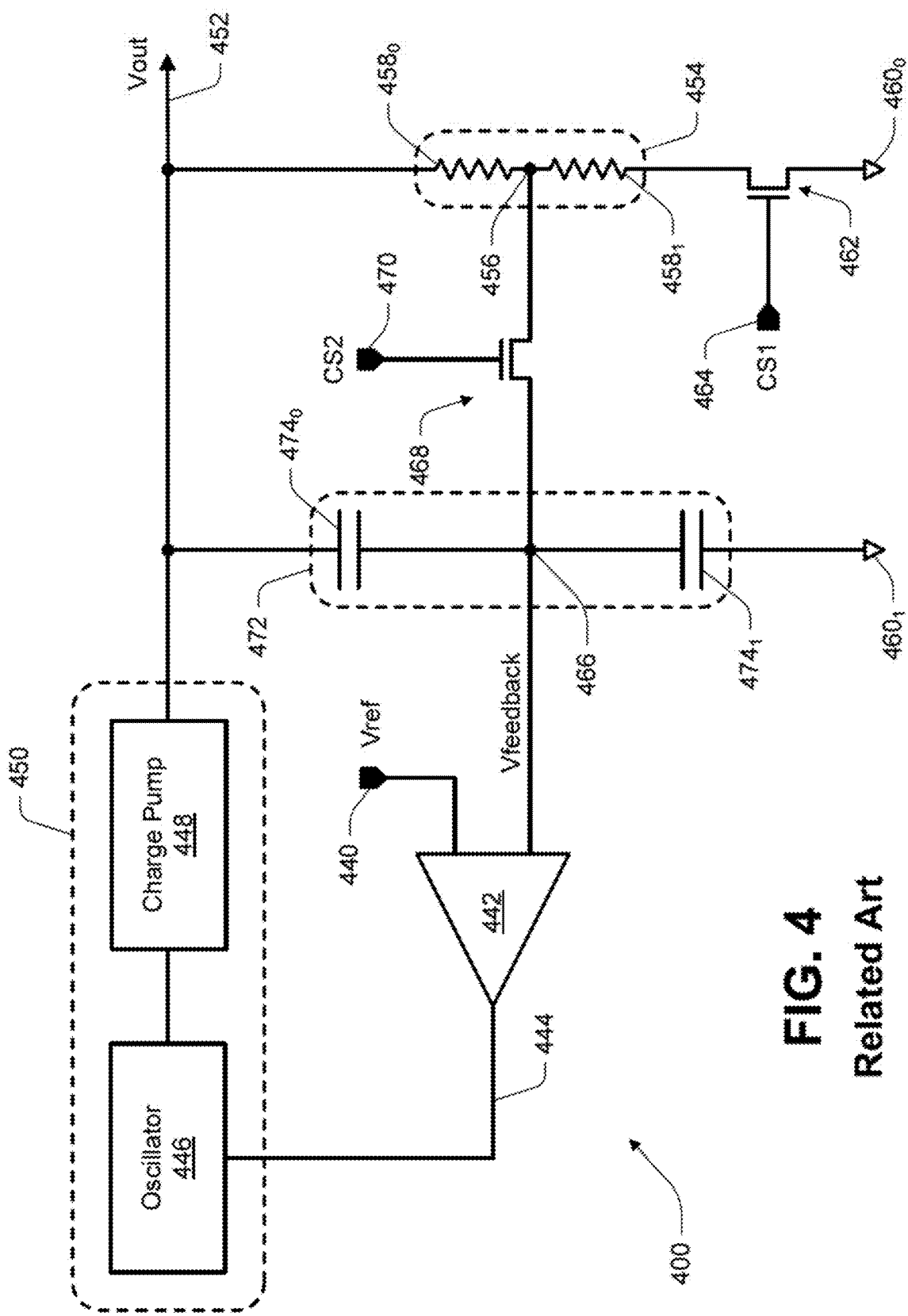
FIG. 4 is a block schematic of a voltage generation system of the related art.

FIG. 4 is a block schematic of a voltage generation system 400 of the related art. The voltage generation system 400 might be responsive to an analog control signal, e.g., Vref, received on control signal node 440, that might be generated by a digital to analog converter (DAC) (not depicted in FIG. 4). The control signal Vref might be provided to one input of a comparator 442. The output 444 of comparator 442 might be provided, e.g., as an enable signal, to an oscillator 446. Oscillator 446 might selectively provide an output (e.g., one or more clock signals) in response to the output of the comparator 442. For example, with reference to FIG. 3, the oscillator 446 might provide complementary clock signals CP1 and CP2. Alternatively, the oscillator 446 might provide the clock signal CP1, and an inverter could be used to generate the clock signal CP2.

The output of oscillator 446 might be provided to a charge pump 448 having one or more pump stages. Charge pump 448 might represent any circuit capable of generating a voltage having a magnitude greater than a supply voltage provided to charge pump 448 and/or a polarity different than the supply voltage. As one example, the charge pump 448 might represent a charge pump of the type depicted in FIG. 3. The oscillator 446 and charge pump 448 might collectively be referred to as a voltage generation circuit 450. The output of charge pump 448 might represent the voltage level, e.g., Vout, generated at the output 452 of the voltage generation circuit 450. Voltage generation circuit 450 might alternatively include any circuit configured to generate a voltage level responsive to a logic level of an input control signal, e.g., the output 444 of comparator 442.

To adjust a voltage level of Vout, and to increase stability of the voltage level, Vout might be provided to a feedback loop including resistive feedback (e.g., a resistive voltage divider 454), capacitive feedback (e.g., a capacitive voltage divider 472), and a comparator 442. The resistive voltage divider 454 is conceptually depicted as having a node 456 between a top resistance $458_0$ and a bottom resistance $458_1$. The resistance $458_1$ might further be selectively connected to a voltage node $460_0$ through the n-type field-effect transistor (nFET) 462. The nFET 462 might have a control gate connected to the control signal node 464 to receive a control signal CS1. Voltage node $460_0$ might be configured to receive a bottom-rail supply voltage, e.g., a reference potential, such as the supply voltage Vss, which might be ground or 0V.

The node 456 might be selectively connected to a node 466 through the nFET 468. The nFET 468 might have a control gate connected to the control signal node 470 to receive a control signal CS2. While the node 456 is connected to the node 466 and to the voltage node $460_0$, the node 456 might assume a voltage level, e.g., Vfeedback, between Vout and the voltage level of the voltage node $460_0$, depending upon the resistance ratio of the resistances $458_0$ and $458_1$. Vfeedback might be provided to a second input of comparator 442, thereby generating an output signal of the comparator 442 having a first logic level, e.g., a logic high level, when a voltage level of Vout results in a voltage level of Vfeedback that is lower than the voltage level of Vref, and having a second logic level, e.g., a logic low level, when a voltage level of Vout results in a voltage level of Vfeedback that is higher than the voltage level of Vref. In this manner, the first logic level of the comparator 442 might signal to the voltage generation circuit 450 to enable the oscillator 446 to generate its output clock signal(s) to operate the charge pump 448 when Vout is below a target voltage level, while the second logic level of the comparator 442 might signal to the voltage generation circuit 450 to disable the oscillator 446 when Vout is above the target voltage level.

Although resistive voltage dividers are commonly used in the control of voltage generation systems, they can lead to significant current draw. For example, when the resistances $458_0$ and $458_1$ are connected to the voltage node $460_0$, current will generally be continuously sunk from the output 452 to the voltage node $460_0$. To address this issue, capacitive voltage dividers have often been incorporated. As depicted, the capacitive voltage divider 472 might include a top capacitance $474_0$ having a first electrode connected to the output 452 and having a second electrode connected to the node 466, and might further include a bottom capacitance $474_1$ having a first electrode connected to the node 466 and having a second electrode connected to the voltage node $460_1$. Voltage node $460_1$ might be configured to receive a bottom-rail supply voltage, e.g., a reference potential, such as the supply voltage Vss, which might be ground or 0V.

In operation, after charging up the node 466 to a voltage level representative of the divided voltage level of Vout, the resistive voltage divider 454 could be isolated from the node 466 and from the voltage node $460_0$ by deactivating the nFET 468 and deactivating the nFET 462, respectively. Changes in voltage level of Vout might still be reflected in the voltage level at node 466, but the current draw through the resistive voltage divider 454 might be mitigated.

While changes in the voltage level of Vout might still be reflected in the voltage level at node 466 while the resistive voltage divider 454 is isolated from node 466, current leakage might be inevitable, such that continuous operation in this manner might lead to errors in the resulting voltage level of Vout. In addition, significant changes in the voltage level of Vout, e.g., from attaching a load to the output 452, might not be adequately reflected in the voltage level of the node 466. As such, it is common in voltage generation systems of the type depicted in FIG. 4 to periodically or selectively re-connect the node 456 to the node 466 and to the voltage node $460_0$. However, while the resistances $458_0$ and $458_1$ are isolated from the node 466 and from the voltage node $460_0$, the voltage level of the node 456 might tend to equilibrate with Vout. To address this issue, the nFET 462 might typically be activated prior to activating the nFET 468, in order to permit the node 456 to return to a voltage level of Vfeedback that is representative of the voltage level of Vout prior to re-connecting the node 456 to the node 466. The delay between activating the nFET 462 and the nFET 468 might be dependent upon an expected time to return the voltage level of the node 456 to steady state after connecting it to the voltage node $460_0$.

While the use of a capacitive voltage divider 472 in coordination with a resistive voltage divider 454 in the manner described above might provide advantages over the use of a resistive voltage divider 454 alone, the control logic to determine when to activate the nFET 462 and the nFET 468, and to determine appropriate delays between activing the nFET 462 and the nFET 468 for different voltage levels of Vout, might be significant. Various embodiments facilitate autonomous control of hybrid control systems utilizing both resistive feedback and capacitive feedback without regard to a voltage level of Vout.

Figure 5:
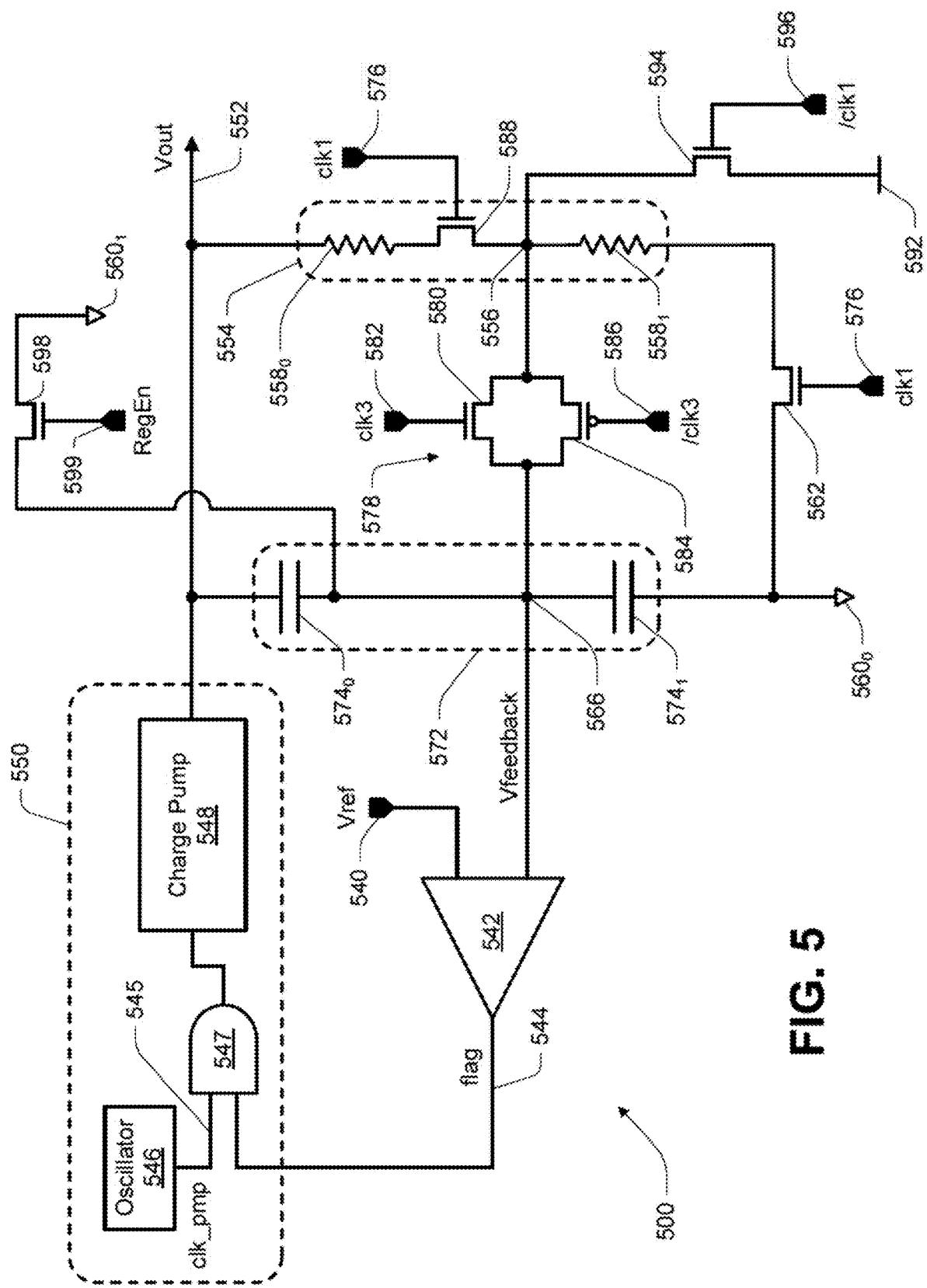
FIG. 5 is a block schematic of a voltage generation system in accordance with an embodiment.

FIG. 5 is a block schematic of a voltage generation system 500 in accordance with an embodiment. The voltage generation system 500 might be responsive to an analog control signal, e.g., Vref, received on control signal node 540, that might be generated by a digital to analog converter (DAC) (not depicted in FIG. 5). The control signal Vref might be provided to one input of a comparator 542. The output 544 of comparator 542 might be provided, e.g., as an enable signal (e.g., a flag signal), to a first input of a logic gate, e.g., AND gate, 547. A second input of the AND gate 547 might be connected to an output 545 of an oscillator 546. The output 545 of the oscillator 546 might provide an oscillating signal, e.g., a clock signal clk_pmp, which might have a duty cycle of 50%. The clock signal clk_pmp might correspond to a clock signal CP1 or CP2 of FIG. 3 for example, while a complement of the clock signal clk_pmp might correspond to the clock signal CP2 or CP1, respectively.

The output of AND gate 547 might be provided to a charge pump 548 having one or more pump stages. Charge pump 548 might represent any circuit capable of generating a voltage having a magnitude greater than a supply voltage provided to charge pump 548 and/or a polarity different than the supply voltage. As one example, the charge pump 548 might represent a charge pump of the type depicted in FIG. 3. The oscillator 546, AND gate 547 and charge pump 548 might collectively be referred to as a voltage generation circuit 550. The output of charge pump 548 might represent the voltage level, e.g., Vout, generated at the output 552 of the voltage generation circuit 550. Voltage generation circuit 550 might alternatively include any circuit configured to generate a voltage level responsive to a level of an input control signal, e.g., the output 544 of comparator 542.

To adjust a voltage level of Vout, and to increase stability of the voltage level, Vout might be provided to a feedback loop including selectively-enabled resistive feedback (e.g., a selectively-enabled resistive voltage divider 554), capacitive feedback (e.g., a capacitive voltage divider 572), and a comparator 542. The resistive voltage divider 554 is conceptually depicted as having a top resistance $558_0$ having a first end connected to the output 552, and a second end selectively connected to a node (e.g., a first feedback node) 556, and having a bottom resistance $558_1$ having a first end connected to the node 556. The resistance $558_1$ might further have a second end selectively connected to a voltage node $560_0$ through the n-type field-effect transistor (nFET) 562. The nFET 562 might have a control gate connected to the control signal node 576 to receive a control signal clk1, a first source/drain connected to the second end of the resistance $558_1$, and a second source/drain connected to the voltage node $560_0$. Voltage node $560_0$ might be configured to receive a voltage level different than (e.g., lower than) a target voltage level of Vout. Voltage node $560_0$ might be configured to receive a bottom-rail supply voltage, e.g., a reference potential, such as the supply voltage Vss, which might be ground or 0V. As one example, the resistance $558_0$ might have a resistance value that is 10 to 20 times the resistance value of the resistance $558_1$. While depicted as static resistances, the resistances $558_0$ and $558_1$ might alternatively represent adjustable resistances to permit altering a resistance ratio of $558_0/(558_0+558_1)$. Adjustable resistances in a resistive voltage divider are well understood. See, e.g., U.S. Pat. No. 9,659,602 to Qiao et al.

The node 556 might be selectively connected to a node (e.g., a second feedback node) 566 through a transfer gate 578. The transfer gate 578 might include an nFET 580 having a control gate connected to the control signal node 582 to receive a control signal clk3, a first source/drain connected to the node 556, and a second source/drain connected to the node 566. The transfer gate 578 might further include a p-type field-effect transistor (pFET) 584 having a control gate connected to the control signal node 586 to receive a control signal/clk3, a first source/drain connected to the node 556, and a second source/drain connected to the node 566. The control signal/clk3 might be the complement of the control signal clk3. Alternatively, the transfer gate 578 might be replaced with a single transistor, e.g., the nFET 580.

The node 556 might further be selectively connected to resistance $558_0$, and to the output 552, through an nFET 588 having a control gate connected to the control signal node 576 to receive the control signal clk1, a first source/drain connected to the second end of the resistance $558_0$, and a second source/drain connected to the node 556. And the node 556 might further be selectively connected to a voltage node 592 through an nFET 594 having a control gate connected to the control signal node 596 to receive the control signal/clk1, a first source/drain connected to the node 556, and a second source/drain connected to the voltage node 592. The control signal/clk1 might be the complement of the control signal clk1. Voltage node 592 might be configured to receive a voltage level between a target voltage level of Vout and a voltage level of the voltage node $560_0$. Voltage node 592 might further be configured to receive a voltage level within a voltage domain of the comparator 542, e.g., within a range of voltage levels for which the comparator 542 is configured to operate. For some embodiments, voltage node 592 might be configured to receive a voltage level near the control signal Vref. Voltage node 592 might be configured to receive a top-rail supply voltage, such as the supply voltage Vcc.

While the node 556 is connected to the node 566, to the voltage node $560_0$, and to the output 552, while isolated from the voltage node 592, the node 556 might assume a voltage level, e.g., Vfeedback, between Vout and the voltage level of the voltage node $560_0$, depending upon the resistance ratio of the resistances $558_0$ and $558_1$. Vfeedback might be provided to a second input of comparator 542, thereby generating an output signal of the comparator 542 having a first logic level, e.g., a logic high level, when a voltage level of Vout results in a voltage level of Vfeedback that is lower than the voltage level of Vref, and having a second logic level, e.g., a logic low level, when a voltage level of Vout results in a voltage level of Vfeedback that is higher than the voltage level of Vref. In this manner, the first logic level of the comparator 542 might signal to the voltage generation circuit 550 to enable the charge pump 548, e.g., by passing the output of the oscillator 546 to the charge pump 548, when Vout is below a target voltage level. In contrast, the second logic level of the comparator 542 might signal to the voltage generation circuit 550 to disable the charge pump 548, e.g., to isolate the output of the oscillator 546 from the charge pump 548, when Vout is above the target voltage level. The ratio of the resistance $558_0$ to the resistance $558_1$ might be sized to provide a feedback voltage Vfeedback equal to the control signal Vref when the output voltage Vout equals its target voltage level.

The voltage generation system 500 might further include the capacitive voltage divider 572. As depicted, the capacitive voltage divider 572 might include a top capacitance $574_0$ having a first electrode connected to the output 552 and having a second electrode connected to the node 566, and might further include a bottom capacitance 5741 having a first electrode connected to the node 566 and having a second electrode connected to the voltage node $560_0$. As one example, the capacitance $574_0$ might have a capacitance value that is approximately five times the capacitance value of the capacitance 5741. Larger capacitance ratios might lead to smoother voltage control, but generally require larger areas.

The voltage generation system 500 might further selectively connect the node 566 to a voltage node $560_1$, e.g., through an nFET 598 having a control gate connected to the control signal node 599 configured to receive a control signal RegEn. Deactivating the nFET 598 might serve to enable voltage regulation by allowing the node 566 to have a voltage level representative of the divided voltage level of Vout. Activating the nFET 598 might serve to disable voltage regulation by pulling the node 566 to the voltage level of the voltage node $560_1$. Voltage node $560_1$ might be configured to receive a bottom-rail supply voltage, e.g., a reference potential, such as the supply voltage Vss, which might be ground or 0V. Alternatively, the voltage node $560_1$ might be configured to receive a voltage level higher than the control signal Vref, depending upon the desired logic level of the output 544 of the comparator 542 while voltage regulation is disabled. This might include a top-rail supply voltage, such as the supply voltage Vcc. Furthermore, the oscillator 546 might be disabled when the control signal RegEn has a logic level configured to connect the node 566 to the voltage node $560_1$ such that the logic level of the output 544 of the comparator 542 might be irrelevant.

In operation, after charging up the node 566 to a voltage level representative of the divided voltage level of Vout, the node 556 could be isolated from the node 566 and from the voltage node $560_0$ by deactivating the transfer gate 578 and deactivating the nFET 562, respectively. Changes in voltage level of Vout might still be reflected in the voltage level at node 566, but the current draw through the resistive voltage divider 554 might be mitigated.

While the node 556 is isolated from the node 566 and from the voltage node $560_0$, the node 556 might further be isolated from the output 552 by deactivating the nFET 588. In this case, the voltage generation system 500 might not need to charge any parasitic capacitances that might be present below the resistor $558_0$, in contrast to the voltage generation system 400 of FIG. 4. This might facilitate further reductions in power consumption over the related art.

In addition, the node 556 might be connected to the voltage node 592 by activating the nFET 594.

While changes in the voltage level of Vout might still be reflected in the voltage level at node 566 while the resistive voltage divider 554 is isolated from node 566, current leakage might be inevitable, such that continuous operation in this manner might lead to errors in the resulting voltage level of Vout. In addition, significant changes in the voltage level of Vout, e.g., from attaching a load to the output 552, might not be adequately reflected in the voltage level of the node 566. As such, the voltage generation system 500 might be configured to periodically or selectively re-connect the node 556 to the node 566, to the output 552, and to the voltage node $560_0$. In contrast to the voltage generation system of FIG. 4, when the resistive feedback is disabled, the node 556 might equilibrate toward a voltage level equal to a voltage level of the voltage node 592 minus a threshold voltage (Vt) of the nFET 594, which might be expected to be closer to the voltage level of Vfeedback that is representative of the voltage level of Vout. As such, lesser delay might be utilized between connecting the node 556 to the output 552 and to the voltage node $560_0$, and connecting the node 556 to the node 566, when enabling (e.g., re-enabling) the resistive feedback. This delay might be independent of the target voltage level of Vout, such that a same delay could be utilized for a variety of different target voltage levels of Vout, which could facilitate less complex control schemes over the related art. In addition, this delay might approach zero as the voltage level of the voltage node 592 minus the Vt of the nFET 594 approaches Vref.

Figure 6:
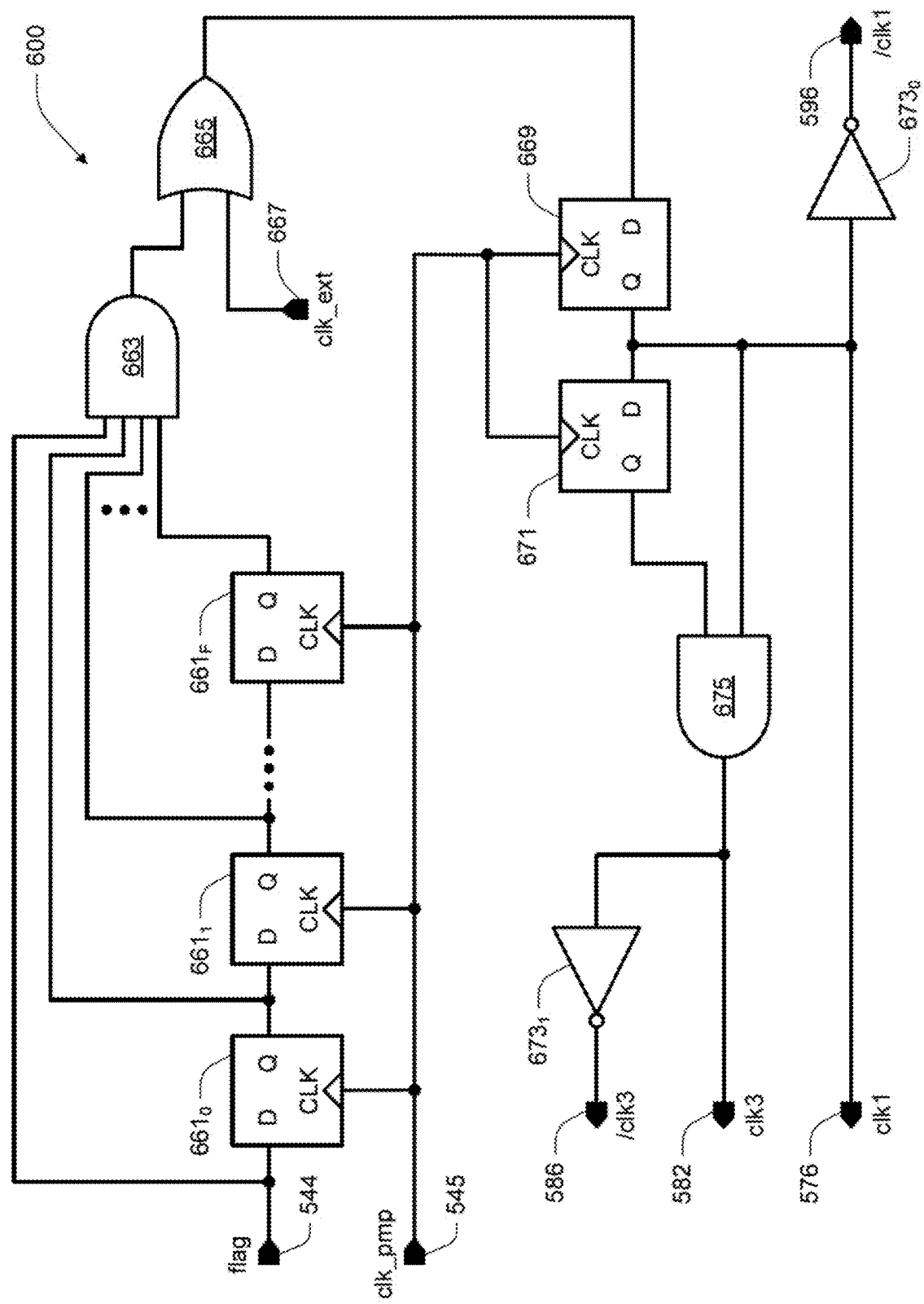
FIG. 6 is a block schematic of a control signal generator in accordance with an embodiment.

FIG. 6 is a block schematic of a control signal generator 600 in accordance with an embodiment. The control signal generator 600 might represent a functionality of a controller, e.g., control logic 116. The control signal generator 600 might include a number of serially-connected flip-flops 661, e.g., D flip-flops. For example, a first flip-flop $661_0$ might have an input (e.g., D input) connected to a signal node configured to receive a signal representative of a desire to enable a voltage generation circuit, e.g., the output 544 of the comparator 542. The input of the first flip-flop $661_0$ (e.g., the flag signal from the output 544 of the comparator 542) might further be connected to a respective input of an AND gate 663. An output (e.g., Q output) of the first flip-flop $661_0$ might be connected to an input (e.g., D input) of a second flip-flop $661_1$. The input of the second flip-flop $661_1$ might further be connected to a respective input of the AND gate 663. Such series connection might be repeated for each of the flip-flops 661 such that an output (e.g., Q output) of a flip-flop $661_Y$ might be connected to an input (e.g., D input) of a flip-flop $661_{Y+1}$ for each value of Y from 0 to F−1. The input (e.g., D input) of each flip-flop $661_0$-$661_F$ might be connected to a respective input of the AND gate 663, and the output (e.g., Q output) of each flip-flop $661_0$-$661_F$ might be connected to a respective input of the AND gate 663. In this manner, as depicted in FIG. 6, the AND gate 663 might include one more input than a number of flip-flops 661, or F+2 inputs in this example.

Each of the flip-flops $661_0$-$661_F$ might have a clock input CLK connected to a clock signal node (e.g., the output 545 of the oscillator 546) configured to receive a first clock signal, such as the clock signal clk_pmp. In this manner, the output of the AND gate 663 might have a logic low level if the output of any of the flip-flops 661, or the input of the flip-flop $661_0$, is logic low, and might have a logic high level if all of the outputs of the flip-flops 661, and the input of the flip-flop $661_0$, are logic high. Due to the nature of the clocked flip-flops 661, the output of the AND gate 663 might have a logic high level in response to the output 544 of the comparator 542 having a logic high level for a number of consecutive clock cycles of the clock signal clk_pmp equal to (or greater than) F+1.

The output of the AND gate 663 might be connected to a first input of an OR gate 665. A second input of the OR gate 665 might be connected to a clock signal node 667 configured to receive a second clock signal, such as an external clock signal clk_ext. Although not depicted, the external clock signal clk_ext might be received by a memory 100 through the control link 132, for example. Alternatively, the second clock signal could be generated internally to an integrated circuit device.

The second clock signal might have a period that is greater than the period of the first clock signal. For some embodiments, the second clock signal has a period at least one order of magnitude greater than the period of the first clock signal. For further embodiments, the second clock signal has a period at least two orders of magnitude greater than the period of the first clock signal. As one example, the period of the first clock signal might be on the order of tens of nanoseconds while the period of the second clock signal might be on the order of microseconds. Smaller periods of the first clock signal might facilitate increased response to sudden load changes of the voltage generation system. Larger periods of the second clock signal might facilitate power savings by reducing periodic enabling of the resistive voltage divider. The second clock signal might further have a duty cycle lower than the first clock signal. For example, the second clock signal might have a duty cycle of 12.5%. Lower duty cycles of the second clock signal might provide for power savings, but the duty cycle of the second clock signal should be selected to facilitate the node 566 reaching equilibrium with the node 556 when the resistive voltage divider 554 is enabled.

The output of the OR gate 665 might be connected to an input (e.g., D input) of an optional flip-flop (e.g., D flip-flop) 669. The flip-flop 669 might have a clock input CLK connected to a signal node configured to receive the first clock signal, such as the clock signal clk_pmp from the output 545 of the oscillator 546. An output (e.g., Q output) of the flip-flop 669 might be connected to the control signal node 576 to provide the control signal clk1. The flip-flop 669 might be provided to synchronize transitions of the control signal clk1 to the first clock signal. However, similar functionality could be provided in the absence of the flip-flop 669, such that the flip-flop 669 might be removed.

The output of the flip-flop 669 might further be connected to an input of an inverter $673_0$, whose output might be connected to the control signal node 596 to provide the control signal /clk1. The output (e.g., Q output) of the flip-flop 669 might further be connected to an input (e.g., D input) of an optional flip-flop 671 (e.g., D flip-flop), and to a first input of an AND gate 675. The flip-flop 671 might have a clock input CLK connected to a signal node configured to receive the first clock signal, such as the clock signal clk_pmp from the output 545 of the oscillator 546. The output of the flip-flop 671 might be connected to a second input of the AND gate 675, whose output might be connected to the control signal node 582 to provide the control signal clk3. The flip-flop 671 might provide for a delay, e.g., one clock cycle of the first clock signal, between transitions of the control signal clk1 and the control signal clk3. The output of the AND gate 675 might further be connected to an input of an inverter $673_1$, whose output might be connected to the control signal node 586 to provide the control signal /clk3. To provide additional delay, e.g., additional clock cycles of the first clock signal, the flip-flop 671 might represent a number of flip-flops connected in series between the output of the flip-flop 669 and the second input of the AND gate 675. Alternatively, if the voltage level of the voltage node 592 approaches the voltage level of the control signal Vref, such delay might be mooted, and the flip-flop 671, AND gate 675 and inverter $673_1$ might be eliminated. For such an embodiment, the control signal node 582 could be connected to the control signal node 576, and the control signal node 586 could be connected to the control signal node 596.

With reference to FIGS. 5 and 6, it can be seen that selective enablement of the resistive voltage divider 554, and selective connection of the first feedback node 556 to the second feedback node 566, are responsive to a logic level of the output of the OR gate 665. While delays might be inserted, e.g., through the flip-flops 669 and 671, or logic levels might be inverted, e.g., through the inverters $673_0$ and $673_1$, each of the control signals clk1, /clk1, clk3 and/clk3 is responsive to the logic level of the output of the OR gate 665.

Figure 7:
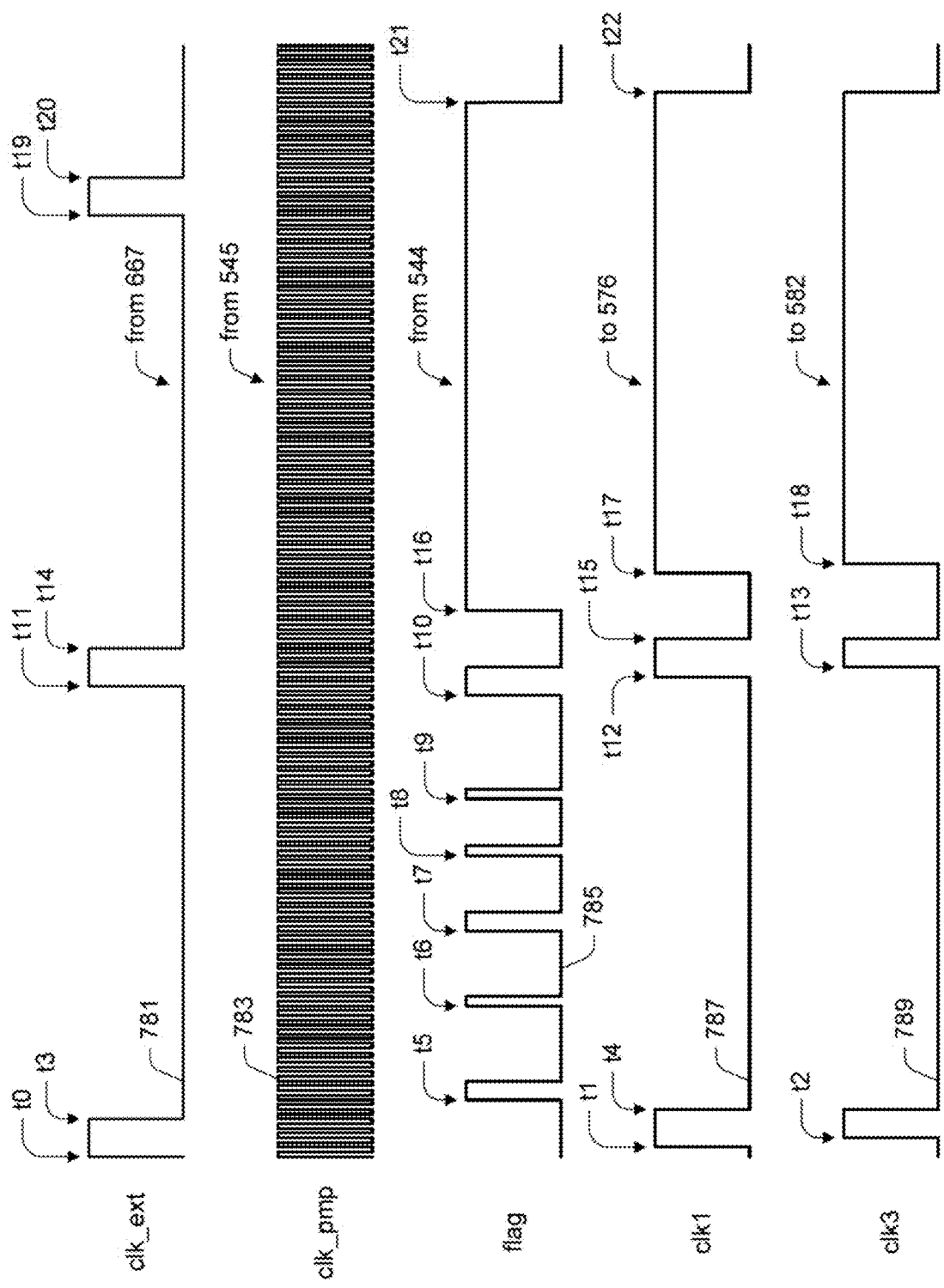
FIG. 7 is a conceptual example of a timing diagram of various signals of FIG. 6 in accordance with an embodiment.

FIG. 7 is a conceptual example of a timing diagram of various signals of FIG. 6 in accordance with an embodiment. Trace 781 might represent the second clock signal clk_ext from the signal node 667. Trace 783 might represent the first clock signal clk_pmp from the output 545 of the oscillator 546. Trace 785 might represent the flag signal from the output 544 of the comparator 542. Trance 787 might represent the control signal clk1 to the control signal node 576. Trace 789 might represent the control signal clk3 to the control signal node 582.

The following description of FIG. 7 will be made using the example structure of FIG. 6, and assuming F equals 1 (e.g., two flip-flops 661 connected in series). At time t0, the second clock signal clk_ext might transition high. In response, the control signal clk1 might transition high at time t1, e.g., one clock cycle of the first clock signal clk_pmp after time t0. In response to the control signal clk1 transitioning high at time t1, the control signal clk3 might transition high at time t2, e.g., one clock cycle of the first clock signal clk_pmp after time t1. At time t3, the second clock signal clk_ext might transition low. In response, the control signals clk1 and clk3 might transition low at time t4, e.g., one clock cycle of the first clock signal clk_pmp after time t3.

At time t5, the flag signal might transition high, but might subsequently transition low before a sufficient number of clock cycles of the first clock signal clk_pmp (e.g., three clock cycles) to cause the output of the AND gate 663 to transition high and trigger a transition of the control signal clk1. The flag signal further might make such high/low transitions at times t6, t7, t8, t9 and t10, each of insufficient time to cause a transition in the control signal clk1.

At time t11, the second clock signal clk_ext might transition high. In response, the control signal clk1 might transition high at time t12, e.g., one clock cycle of the first clock signal clk_pmp after time t11. In response to the control signal clk1 transitioning high at time t12, the control signal clk3 might transition high at time t13, e.g., one clock cycle of the first clock signal clk_pmp after time t12. At time t14, the second clock signal clk_ext might transition low. In response, the control signals clk1 and clk3 might transition low at time t15, e.g., one clock cycle of the first clock signal clk_pmp after time t14.

At time t16, the flag signal might transition high, and might remain high for a sufficient number of clock cycles of the first clock signal clk_pmp (e.g., three clock cycles in this example) to cause the output of the AND gate 663 to transition high and trigger a transition of the control signal clk1. In response, the control signal clk1 might transition high at time t17, e.g., four clock cycles of the first clock signal clk_pmp after time t16 in this example. In response to the control signal clk1 transitioning high at time t17, the control signal clk3 might transition high at time t18, e.g., one clock cycle of the first clock signal clk_pmp after time t17. At time t19, the second clock signal clk_ext might transition high. At time t20, the second clock signal clk_ext might transition low. However, as the flag signal has been high for a sufficient number of clock cycles of the first clock signal clk_pmp at time t19, the transitions of the second clock signal might have no effect on the control signals clk1 and clk3. At time t21, the flag signal might transition low. In response, the control signals clk1 and clk3 might transition low at time t22, e.g., one clock cycle of the first clock signal clk_pmp after time t21.

Figure 8:
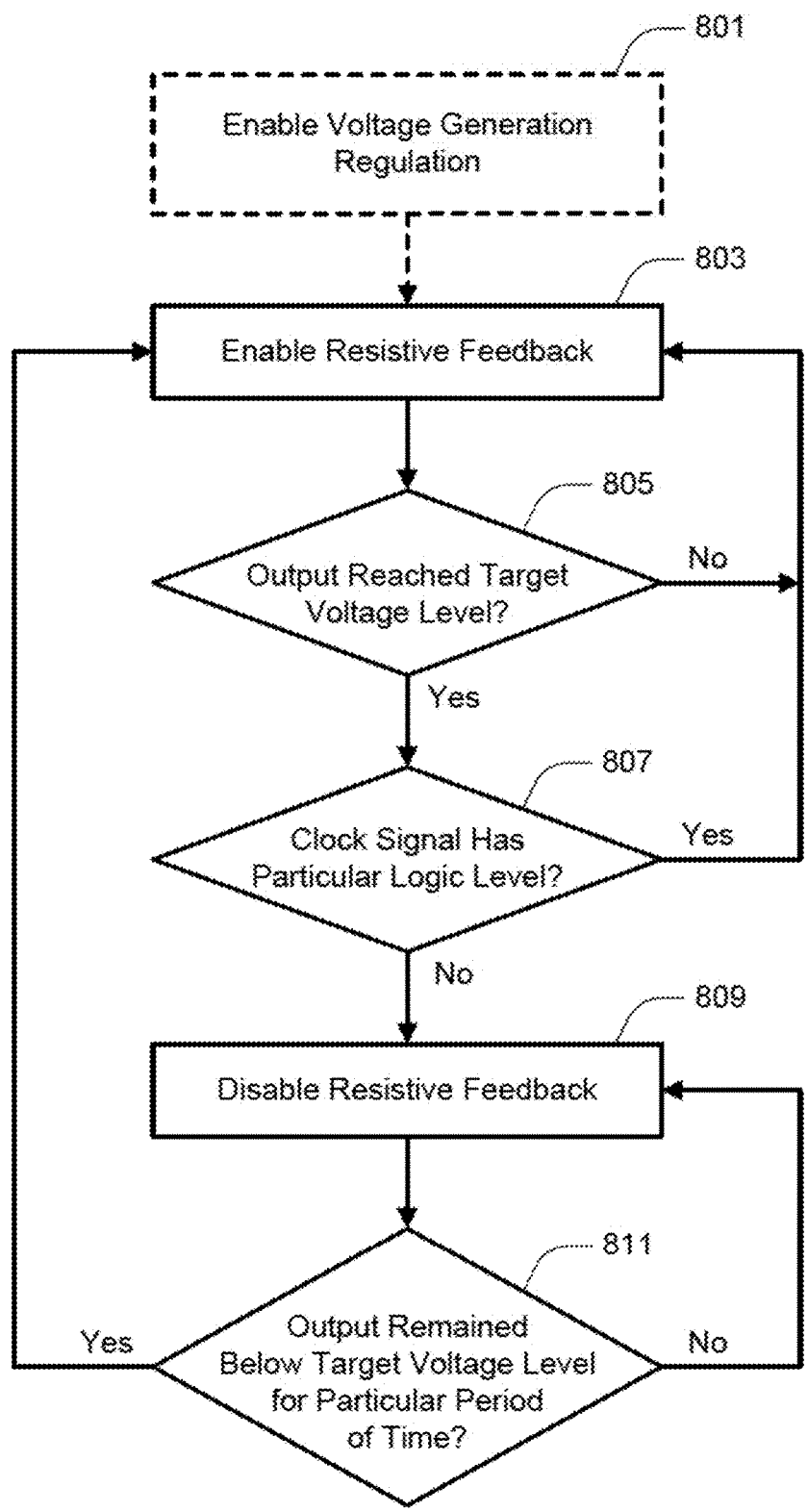
FIG. 8 is a flowchart of a method of operating a voltage generation system in accordance with an embodiment.

FIG. 8 is a flowchart of a method of operating an apparatus in accordance with an embodiment. The method might represent actions associated with generating an internal voltage level of an integrated circuit device, e.g., during an access operation of a semiconductor memory. The method might be in the form of computer-readable instructions, e.g., stored to the instruction registers 128. Such computer-readable instructions might be executed by a controller, e.g., the control logic 116, to cause the apparatus (e.g., relevant components of the apparatus) to perform the method.

At 801, voltage generation regulation of a voltage generation system might be enabled. For example, with reference to the voltage generation system of FIG. 5, the control signal RegEn might be transitioned to a logic low level. At 803, resistive feedback of the voltage generation system might be enabled. For example, the resistive voltage divider 554 might be enabled by transitioning the control signals clk1 and clk3 to logic high levels (e.g., as described with reference to FIGS. 6 and 7) and transitioning the control signals/clk1 and/clk3 to logic low levels (e.g., as complements of the control signals clk1 and clk3, respectively).

At 805, it might be determined whether the output of the voltage generation system has reached its target voltage level. For example, it might be determined whether the feedback voltage Vfeedback has reached a voltage level of the control signal Vref. If the output has not reached its target voltage level, the method might return to 803 to enable (e.g., maintain enablement) of the resistive feedback. At 807, it might be determined whether a clock signal has a particular logic level. For example, it might be determined whether the second clock signal clk_ext has a logic high level. If the clock signal has the particular logic level, the method might return to 803 to enable (e.g., maintain enablement) of the resistive feedback. If the clock signal does not have the particular logic level at 807, and the output did reach its target voltage level at 805, the resistive feedback might be disabled at 809. For example, the resistive voltage divider 554 might be disabled by transitioning the control signals clk1 and clk3 to logic low levels (e.g., as described with reference to FIGS. 6 and 7) and transitioning the control signals/clk1 and /clk3 to logic high levels (e.g., as complements of the control signals clk1 and clk3, respectively).

At 811, e.g., subsequent to disabling the resistive feedback of the voltage generation system, it might be determined whether the output of the voltage generation systems remains below its target voltage level for a particular period of time. For example, it might be determined whether the feedback voltage Vfeedback has remained below the voltage level of the control signal Vref for a predetermined number of clock cycles, e.g., a particular number of cycles (e.g., consecutive cycles) of the first clock signal clk_pmp. With reference to FIG. 6, the number of flip-flops 661 incorporated into the control signal generator 600 might be used to select, e.g., define, the predetermined number of clock cycles of the first clock signal. If the output has not remained below the target voltage level for the particular period of time, the method might return to 809 to disable (e.g., maintain disablement) of the resistive feedback. If the output has remained below the target voltage level for the particular period of time, the method might return to 803 to enable the resistive feedback. For some embodiments, the method might further return to 803 to enable the resistive feedback if the clock signal (e.g., the second clock signal clk_ext) is determined to have the particular logic level.

Figure 9:
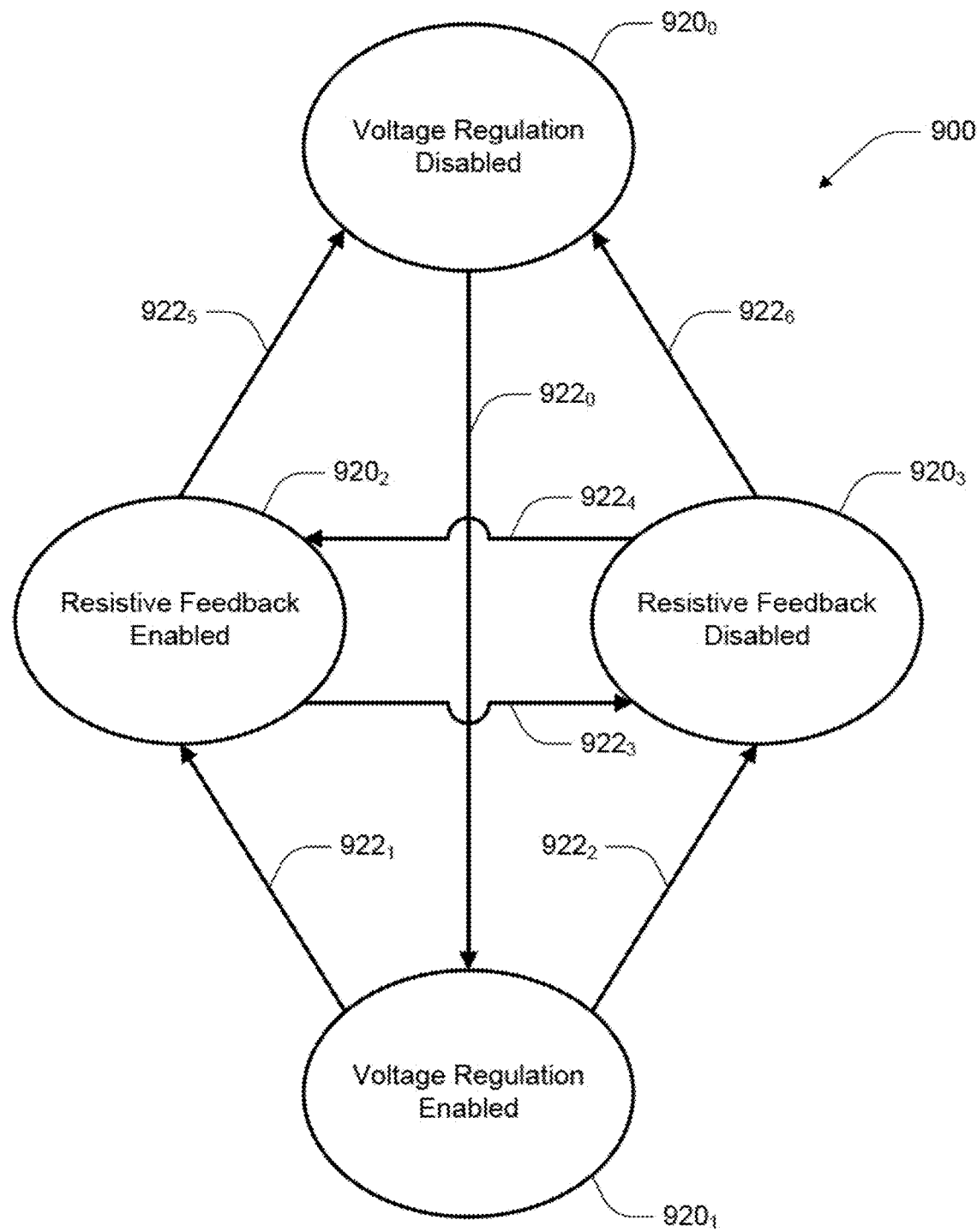
FIG. 9 is a state diagram of voltage regulation in an integrated circuit device in accordance with an embodiment.

FIG. 9 is a state diagram 900 of voltage regulation in an integrated circuit device in accordance with an embodiment. For example, the state diagram 900 might correspond to regulation of a voltage generation system of a memory during an access operation, e.g., a sensing operation (which might include a read operation or a verify operation), a programming operation or an erase operation, on memory cells of an array of memory cells. The state diagram 900 might represent processing of a controller, e.g., the control logic 116. The actions of the state diagram 900 might be defined in the form of computer-readable instructions, e.g., stored to the instruction registers 128. Such computer-readable instructions might be executed by a controller, e.g., the control logic 116, to cause the integrated circuit device (e.g., memory) to perform the actions of the state diagram 900. The state diagram 900 will be discussed with reference to the voltage generation system 500 of FIG. 5 and the control signal generator 600 as an example.

The state diagram 900 might initialize at the state $920_0$ with voltage regulation disabled. For example, the control signal RegEn might have a logic high level. The transition point $922_0$ might be responsive to the control signal RegEn transitioning to a logic low level, and the state might then advance to state $920_1$ with voltage regulation enabled. The control signal RegEn might transition to the logic low level during an initialization of an access operation of a memory, and might remain at the logic low level during the access operation.

The transition point $922_1$ might be responsive to the voltage level of Vout being lower than a target voltage level of the voltage generation system 500, or the second clock signal clk_ext having a logic high level, when voltage regulation is initially enabled, and the state might then advance to state $920_2$ with resistive feedback enabled, e.g., control signals clk1 and clk3 having logic high levels, and control signals/clk1 and/clk3 having logic low levels. For some embodiments, the control signal RegEn might transition to the logic low level synchronized with a transition of the second clock signal clk_ext to a logic high level. Although generally less likely to occur from the state $920_1$, the transition point $922_2$ might be responsive to the voltage level of Vout being higher than the target voltage level of the voltage generation system 500, and the second clock signal clk_ext having a logic low level, when voltage regulation is initially enabled, and the state might then advance to state $920_3$ with resistive feedback disabled, e.g., control signals clk1 and clk3 having logic low levels, and control signals/ clk1 and/clk3 having logic high levels.

From state $920_2$, the transition point $922_3$ might be responsive to the voltage level of Vout being higher than the target voltage level of the voltage generation system 500, and the second clock signal clk_ext having a logic low level, and the state might then advance to state $920_3$ with resistive feedback disabled. From state $920_3$, the transition point $922_4$ might be responsive to the voltage level of Vout being lower than the target voltage level of the voltage generation system 500 for a particular period of time, or the second clock signal clk_ext having a logic high level, and the state might then advance to state $920_2$ with resistive feedback enabled. From states $920_2$ and $920_3$, the transition points $922_5$ and $922_6$, respectively, might be responsive to the control signal RegEn having a logic high level, and the state might then advance to $920_0$, in either scenario, with voltage regulation disabled.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A voltage generation system for an integrated circuit device, comprising:
   a resistive voltage divider having a first resistance connected between an output of the voltage generation system and a first feedback node, and having a second resistance connected between the first feedback node and a first voltage node configured to receive a first voltage level;
   a capacitive voltage divider having a first capacitance connected between the output of the voltage generation system and a second feedback node, and having a second capacitance connected between the second feedback node and the first voltage node;
   a comparator having a first input connected to the second feedback node, having a second input connected to a control signal node, and having an output; and
   a voltage generation circuit configured to generate a voltage level at the output of the voltage generation system responsive to a logic level of the output of the comparator and to a clock signal;
   wherein the first feedback node is selectively connected to the second feedback node;
   wherein the first resistance is selectively connected to the first feedback node;
   wherein the second resistance is selectively connected to the first voltage node; and
   wherein the first feedback node is selectively connected to a second voltage node configured to receive a second voltage level different than the first voltage level.

2. The voltage generation system of claim 1, wherein the clock signal is a first clock signal, and wherein the voltage generation system further comprises:
   a control signal generator configured to generate a plurality of control signals responsive to the output of the comparator, to the first clock signal, and to a second clock signal having a larger period than the first clock signal;
   wherein the control signal generator is configured to generate a first control signal of the plurality of control signals and a second control signal of the plurality of control signals to have a first logic level in response to the second clock signal having a particular logic level;

wherein the control signal generator is configured to generate the first control signal and the second control signal to have the first logic level in response to the output of the comparator having a particular logic level for a predetermined number of cycles of the first clock signal; and wherein the control signal generator is configured to generate the first control signal and the second control signal to have a second logic level different than the first logic level in response to the output of the comparator having a logic level different than its particular logic level and the second clock signal having a logic level different than its particular logic level.

3. The voltage generation system of claim 2, wherein the first logic level is a logic high level, the particular logic level of the second clock signal is the logic high level, and the particular logic level of the output of the comparator is the logic high level.

4. The voltage generation system of claim 2, wherein the predetermined number of cycles of the first clock signal comprises a first predetermined number of cycles of the first clock signal, wherein the control signal generator is configured to transition the logic level of the second control signal to the first logic level a second predetermined number of cycles of the first clock signal after transitioning the logic level of the first control signal to the first logic level, and wherein the control signal generator is configured to transition the logic level of the second control signal to the second logic level concurrently with transitioning the logic level of the first control signal to the second logic level.

5. The voltage generation system of claim 4, wherein the control signal generator is further configured to generate a third control signal of the plurality of control signals as a complement of the first control signal, wherein the first feedback node is connected to the second feedback node responsive to the second control signal having the first logic level, wherein the first resistance is connected to the first feedback node responsive to the first control signal having the first logic level, wherein the second resistance is connected to the first voltage node responsive to the first control signal having the first logic level, and wherein the first feedback node is connected to the second voltage node responsive to the third control signal having the first logic level.

6. The voltage generation system of claim 5, wherein the control signal generator is further configured to generate a fourth control signal of the plurality of control signals as a complement of the second control signal, and wherein the first feedback node is further connected to the second feedback node responsive to the fourth control signal having the second logic level.

7. The voltage generation system of claim 2, further comprising:

a plurality of serially-connected flip-flops, wherein each flip-flop of the plurality of serially-connected flip-flops has an input, an output, and a clock input, and wherein the clock input of each flip-flop of the plurality of serially-connected flip-flops is connected to a first clock signal node configured to receive the first clock signal;

an AND gate having a plurality of inputs and an output, wherein the input of each flip-flop of the plurality of serially-connected flip-flops is connected to a respective input of the plurality of inputs, and wherein the output of each flip-flop of the plurality of serially-connected flip-flops is connected to a respective input of the plurality of inputs; and an OR gate having a first input, a second input, and an output, wherein the first input is connected to the output of the AND gate, and the second input is connected to a second clock signal node configured to receive the second clock signal.

8. The voltage generation system of claim 7, wherein the first feedback node is selectively connected to the second feedback node responsive to a logic level of the output of the OR gate, wherein the first resistance is selectively connected to the first feedback node responsive to the logic level of the output of the OR gate, wherein the second resistance is selectively connected to the first voltage node responsive to the logic level of the output of the OR gate, and wherein the first feedback node is selectively connected to the second voltage node responsive to the logic level of the output of the OR gate.

9. The voltage generation system of claim 7, wherein the AND gate is a first AND gate and wherein the plurality of serially-connected flip-flops is a plurality of serially-connected first flip-flops, the voltage generation system further comprising:

a second flip-flop having an input connected to the output of the OR gate, an output, and a clock input connected to the first clock signal node;

a third flip-flop having an input connected to the output of the second flip-flop, an output, and a clock input connected to the first clock signal node; and a second AND gate having a first input connected to the output of the second flip-flop, a second input connected to the output of the third flip-flop, and an output.

10. The voltage generation system of claim 9, wherein the first feedback node is selectively connected to the second feedback node responsive to a logic level of the output of the second AND gate, wherein the first resistance is selectively connected to the first feedback node responsive to a logic level of the output of the second flip-flop, wherein the second resistance is selectively connected to the first voltage node responsive to the logic level of the output of the second flip-flop, and wherein the first feedback node is selectively connected to the second voltage node responsive to the logic level of the output of the second flip-flop.

11. The voltage generation system of claim 1, wherein the first resistance is a variable resistance and the second resistance is a variable resistance.

12. The voltage generation system of claim 1, wherein a ratio of the first resistance to the second resistance is larger than a ratio of the first capacitance to the second capacitance.

13. An integrated circuit device, comprising:

a voltage generation system having a feedback loop comprising a comparator, a capacitive feedback and a selectively enabled resistive feedback;

a load selectively connected to an output of the voltage generation system; and a controller, wherein the controller is configured to cause the integrated circuit device to:

enable the resistive feedback;

determine whether an output voltage of the voltage generation system has reached a target voltage level;

determine whether a clock signal has a particular logic level;

disable the resistive feedback in response to the output voltage reaching the target voltage level and the clock signal having a logic level different than the particular logic level;

determine whether the output voltage remains below the target voltage level for a particular period of time; and enable the resistive feedback in response to the output voltage remaining below the target voltage level for the particular period of time.

14. The integrated circuit device of claim 13, wherein the controller being configured to cause the integrated circuit device to enable the resistive feedback in response to the output voltage remaining below the target voltage level for the particular period of time comprises the controller being configured to cause the integrated circuit device to enable the resistive feedback in response to the output voltage remaining below the target voltage level for the particular period of time or the clock signal having the particular logic level.

15. The integrated circuit device of claim 13, wherein the resistive feedback comprises:
a first resistance connected between the output of the voltage generation system and a first feedback node; and
a second resistance connected between the first feedback node and a first voltage node configured to receive a first voltage level;
wherein the first resistance is selectively connected to the first feedback node;
wherein the second resistance is selectively connected to the first voltage node; and
wherein the first feedback node is selectively connected to a second voltage node configured to receive a second voltage level different than the first voltage level.

16. The integrated circuit device of claim 15, wherein the first voltage level is lower than a target voltage level of the output of the voltage generation system, and wherein the second voltage level is between the first voltage level and the target voltage level.

17. The integrated circuit device of claim 15, wherein the capacitive feedback comprises:
a first capacitance connected between the output of the voltage generation system and a second feedback node; and
a second capacitance connected between the second feedback node and the first voltage node;
wherein the second feedback node is selectively connected to the first feedback node.

18. The integrated circuit device of claim 17, wherein the controller is further configured to cause the integrated circuit device to:
connect the first feedback node to the first resistance, connect the second resistance to the first voltage node, and isolate the first feedback node from the second voltage node prior to connecting the second feedback node to the first feedback node; and
isolate the first feedback node from the first resistance, isolate the second resistance from the first voltage node, and connect the first feedback node to the second voltage node concurrently with connecting the second feedback node to the first feedback node.

19. A memory, comprising:
an array of memory cells;
a voltage generation system having a feedback loop comprising a comparator, a capacitive feedback, and a selectively enabled resistive feedback; and
a controller for access of the array of memory cells, wherein the controller, during an access operation of the array of memory cells, is configured to cause the memory to:

enable the resistive feedback in response to an output voltage level of the voltage generation system being lower than a target voltage level for the access operation for a particular period of time, or a clock signal having a particular logic level; and
disable the resistive feedback in response to the output voltage level being higher than the target voltage level and the clock signal having a logic level different than the particular logic level.

20. The memory of claim 19, wherein the resistive feedback comprises:
a first resistance having a first end connected to the output of the voltage generation system and having a second end;
a first transistor having a first source/drain connected to the second end of the first resistance and having a second source/drain connected to a first feedback node;
a second resistance having a first end connected to the first feedback node and having a second end;
a second transistor having a first source/drain connected to the second end of the second resistance and having a second source/drain connected to a first voltage node configured to receive a first voltage level; and
a third transistor having a first source/drain connected to the first feedback node and having a second source/drain connected to a second voltage node configured to receive a second voltage level different than the first voltage level.

21. The memory of claim 20, wherein the first transistor, the second transistor and the third transistor are configured to be activated in response to a same logic level, wherein the first transistor and the second transistor have control gates connected to a first control signal node configured to receive a first control signal, and wherein the third transistor has a control gate connected to a second control signal node configured to receive a second control signal as a complement of the first control signal.

22. The memory of claim 20, wherein the capacitive feedback comprises:
a first capacitance having a first electrode connected to the output of the voltage generation system and having a second electrode connected to a second feedback node; and
a second capacitance having a first electrode connected to the second feedback node and having a second electrode connected to the first voltage node.

23. The memory of claim 22, further comprising:
a fourth transistor having a first source/drain connected to the first feedback node and having a second source/drain connected to the second feedback node.

24. The memory of claim 23, further comprising:
a fifth transistor having a first source/drain connected to the first feedback node and having a second source/drain connected to the second feedback node;
wherein the fourth transistor and the fifth transistor are configured to be activated in response to different logic levels, wherein the fourth transistor has a control gate connected to a third control signal node configured to receive a third control signal, and wherein the fifth transistor has a control gate connected to a fourth control signal node configured to receive a fourth control signal as a complement of the third control signal.

25. The memory of claim 20, wherein the second voltage level is within a voltage domain of the comparator, and wherein the first voltage level is lower than the second voltage level.

26. The memory of claim 19, wherein the clock signal is a first clock signal, and wherein the controller being configured to cause the memory to enable the resistive feedback in response to the output voltage level of the voltage generation system being lower than the target voltage level for the access operation for the particular period of time comprises the controller being configured to cause the memory to enable the resistive feedback in response to the output voltage level of the voltage generation system being lower than the target voltage level for the access operation for the particular number of clock cycles of a second clock signal having a smaller period than the first clock signal.

* * * * *